US009502863B2

(12) United States Patent
Hayakawa et al.

(10) Patent No.: US 9,502,863 B2
(45) Date of Patent: Nov. 22, 2016

(54) SURFACE-EMITTING SEMICONDUCTOR LASER, SURFACE-EMITTING SEMICONDUCTOR LASER DEVICE, OPTICAL TRANSMISSION DEVICE, AND INFORMATION PROCESSING DEVICE (71) Applicant: FUJI XEROX CO., LTD., Tokyo (JP)

(72) Inventors: Junichiro Hayakawa, Kanagawa (JP); Akemi Murakami, Kanagawa (JP); Takashi Kondo, Kanagawa (JP); Kazutaka Takeda, Kanagawa (JP); Naoki Jogan, Kanagawa (JP); Jun Sakurai, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/795,987

(22) Filed: Jul. 10, 2015

(65) Prior Publication Data
US 2016/0064899 A1 Mar. 3, 2016

(30) Foreign Application Priority Data

Aug. 26, 2014 (JP) ................................. 2014-171291
Dec. 1, 2014 (JP) ................................. 2014-243270

(51) Int. Cl.
*H04B 10/00* (2013.01)
*H01S 5/183* (2006.01)
(Continued)

(52) U.S. Cl.
CPC ..... *H01S 5/18311* (2013.01); *G03G 15/04072* (2013.01); *H01S 5/0085* (2013.01); *H01S 5/18344* (2013.01); *H01S 5/34313* (2013.01); *H04B 10/503* (2013.01)

(58) Field of Classification Search
CPC .. H01S 5/18311; H01S 5/18344; H01S 5/22; H01S 5/0085; H01S 5/34313; H04B 10/503; G03G 15/04072; G01B 9/02
USPC ....................................... 398/200; 372/45.01
See application file for complete search history.

(56) References Cited

U.S. PATENT DOCUMENTS 7,830,944 B2 * 11/2010 Takeuchi ............... B82Y 20/00
359/213.1
7,924,899 B2 4/2011 Kondo
(Continued)

FOREIGN PATENT DOCUMENTS

JP 8-125283 A 5/1996
JP 9-83070 A 3/1997
(Continued)

*Primary Examiner* — Tesfaldet Bocure
(74) *Attorney, Agent, or Firm* — Sughrue Mion, PLLC (57) ABSTRACT Provided is a surface-emitting semiconductor laser including a substrate; a first semiconductor multilayer reflector of a first conductivity type formed on the substrate, the first semiconductor multilayer reflector including plural pairs of a low-refractive-index layer and a high-refractive-index layer; a cavity region formed on the first semiconductor multilayer reflector; a second semiconductor multilayer reflector of a second conductivity type formed on the cavity region, the second semiconductor multilayer reflector including plural pairs of a low-refractive-index layer and a high-refractive-index layer; a columnar structure extending from the second semiconductor multilayer reflector to the cavity region; and a current confinement layer formed inside the columnar structure by selective oxidation of a semiconductor layer containing Al. The cavity region includes an active region; and a cavity extension region interposed between the active region and the first semiconductor multilayer reflector.

18 Claims, 8 Drawing Sheets (51) Int. Cl.
*H01S 5/00* (2006.01)
*H01S 5/343* (2006.01)
*G03G 15/04* (2006.01)
*H04B 10/50* (2013.01)

(56) References Cited

U.S. PATENT DOCUMENTS

| | | | |
|---|---|---|---|
| 8,031,755 B2 | 10/2011 | Yoshikawa | |
| 8,451,706 B2* | 5/2013 | Kondo | G02B 6/4206 369/121 |
| 8,824,520 B2* | 9/2014 | Kondo | H01S 5/18358 372/45.01 |
| 9,219,349 B2* | 12/2015 | Takeda | H01S 5/30 |
| 2006/0227835 A1* | 10/2006 | Ueki | H01S 5/18341 372/50.124 |
| 2008/0043793 A1* | 2/2008 | Ueki | H01S 5/18311 372/38.05 |
| 2009/0080489 A1* | 3/2009 | Uchida | B41J 2/435 372/50.124 |
| 2010/0238965 A1* | 9/2010 | Maeda | B82Y 20/00 372/45.012 |
| 2011/0176570 A1* | 7/2011 | Masui | H01S 5/1833 372/45.01 |
| 2013/0252360 A1* | 9/2013 | Hoshino | H01S 5/105 438/32 |
| 2014/0023380 A1 | 1/2014 | Takeda et al. | |
| 2014/0112364 A1* | 4/2014 | Kondo | H01S 5/18358 372/45.01 |
| 2016/0006214 A1* | 1/2016 | Takeda | H01S 5/30 372/50.1 |

FOREIGN PATENT DOCUMENTS

| | | |
|---|---|---|
| JP | 9-97945 A | 4/1997 |
| JP | 2002-359434 A | 12/2002 |
| JP | 2003-92456 A | 3/2003 |
| JP | 2004-128482 A | 4/2004 |
| JP | 4087152 B2 | 2/2008 |
| JP | 2008-78612 A | 4/2008 |
| JP | 2010-114214 A | 5/2010 |
| JP | 2010-186899 A | 8/2010 |
| JP | 2012-15364 A | 1/2012 |
| JP | 2013-93571 A | 5/2013 |
| JP | 2013-168641 A | 8/2013 |
| JP | 2014-22672 A | 2/2014 |

* cited by examiner

SURFACE-EMITTING SEMICONDUCTOR LASER, SURFACE-EMITTING SEMICONDUCTOR LASER DEVICE, OPTICAL TRANSMISSION DEVICE, AND INFORMATION PROCESSING DEVICE

CROSS-REFERENCE TO RELATED APPLICATIONS

This application is based on and claims priority under 35 USC 119 from Japanese Patent Application No. 2014-171291 filed Aug. 26, 2014, and Japanese Patent Application No. 2014-243270 filed Dec. 1, 2014.

BACKGROUND (i) Technical Field

The present invention relates to a surface-emitting semiconductor laser, a surface-emitting semiconductor laser device, an optical transmission device, and an information processing device.

(ii) Related Art

Surface-emitting semiconductor lasers, which are capable of emitting a laser beam in a direction perpendicular to the substrate and readily formed in an array by two-dimensional integration, can be used as, for example, a light source for optical communications, a light source for electronic equipment, or a recording unit of an electrophotographic system.

Common surface-emitting semiconductor lasers include a pair of distributed Bragg reflectors (DBRs) formed on a semiconductor substrate, an active layer interposed between the pair of DBRs, and a cavity spacer layer. When a current is injected into the active layer through electrodes disposed on the respective DBRs, lasing occurs in a direction perpendicular to the substrate.

Limiting a rise in the temperature of the active layer enhances the reliability and temperature characteristics of the surface-emitting semiconductor laser. One effective way to limit the temperature rise is to use a material having high thermal conductivity such as AlAs, which has the highest thermal conductivity among $Al_xGa_{1-x}As$, as a material constituting the DBRs. In general, an oxide confinement layer is formed in the vicinity of the active layer in order to achieve a low-current operation. In order to form the oxide confinement layer, a mesa structure having an adequate size is formed by etching, and thereby a cross section of the oxide confinement layer, which is composed of an easily oxidizable material such as AlAs, is exposed. In general, the bottom of the etched portion is positioned within the lower DBR located away from the active region because, if the bottom of the etched portion is located in the vicinity of the active layer, the reliability of the surface-emitting semiconductor laser may be degraded. In the case where the bottom of the etched portion is present within the lower DBR, a portion of the lower DBR is exposed to an oxidizing atmosphere. Therefore, it is impossible to use AlAs, which is easily oxidizable material, as a material constituting the DBRs. Thus, in an oxide confinement surface-emitting semiconductor laser, it is difficult to limit a rise in the temperature of the active layer since it is not possible to use AlAs as a material of the lower DBR.

SUMMARY

According to an aspect of the invention, there is provided a surface-emitting semiconductor laser including:

a substrate;

a first semiconductor multilayer reflector of a first conductivity type formed on the substrate, the first semiconductor multilayer reflector including plural pairs of a low-refractive-index layer and a high-refractive-index layer;

a cavity region formed on the first semiconductor multilayer reflector;

a second semiconductor multilayer reflector of a second conductivity type formed on the cavity region, the second semiconductor multilayer reflector including plural pairs of a low-refractive-index layer and a high-refractive-index layer;

a columnar structure extending from the second semiconductor multilayer reflector to the cavity region; and a current confinement layer formed inside the columnar structure by selective oxidation of a semiconductor layer containing Al, wherein the cavity region includes
an active region; and
a cavity extension region interposed between the active region and the first semiconductor multilayer reflector, wherein the bottom of the columnar structure is positioned within the cavity extension region in the film-thickness direction, wherein the cavity extension region is composed of $Al_xGa_{1-x}As$, where x represents an Al content, the Al content being set such that the cavity extension region is not substantially subject to oxidation or the degree of oxidation of the cavity extension region is negligible, and wherein the low-refractive-index layer constituting the first semiconductor multilayer reflector has an Al content equal to or higher than an Al content in the current confinement layer.

BRIEF DESCRIPTION OF THE DRAWINGS

Exemplary embodiments of the present invention will be described in detail based on the following figures, wherein.

DETAILED DESCRIPTION

Exemplary embodiments of the invention are described below with reference to the attached drawings. An oxide confinement surface-emitting semiconductor laser (i.e., vertical-cavity surface-emitting laser (VCSEL), and the surface-emitting semiconductor laser is referred to as "VCSEL" hereinafter) is described as an example. Note that the drawings are scaled for ease of visualization of the features of the invention and the dimension of the device illustrated in the drawings is not always the same as that of the actual device.

Exemplary Embodiments

Figure 1:
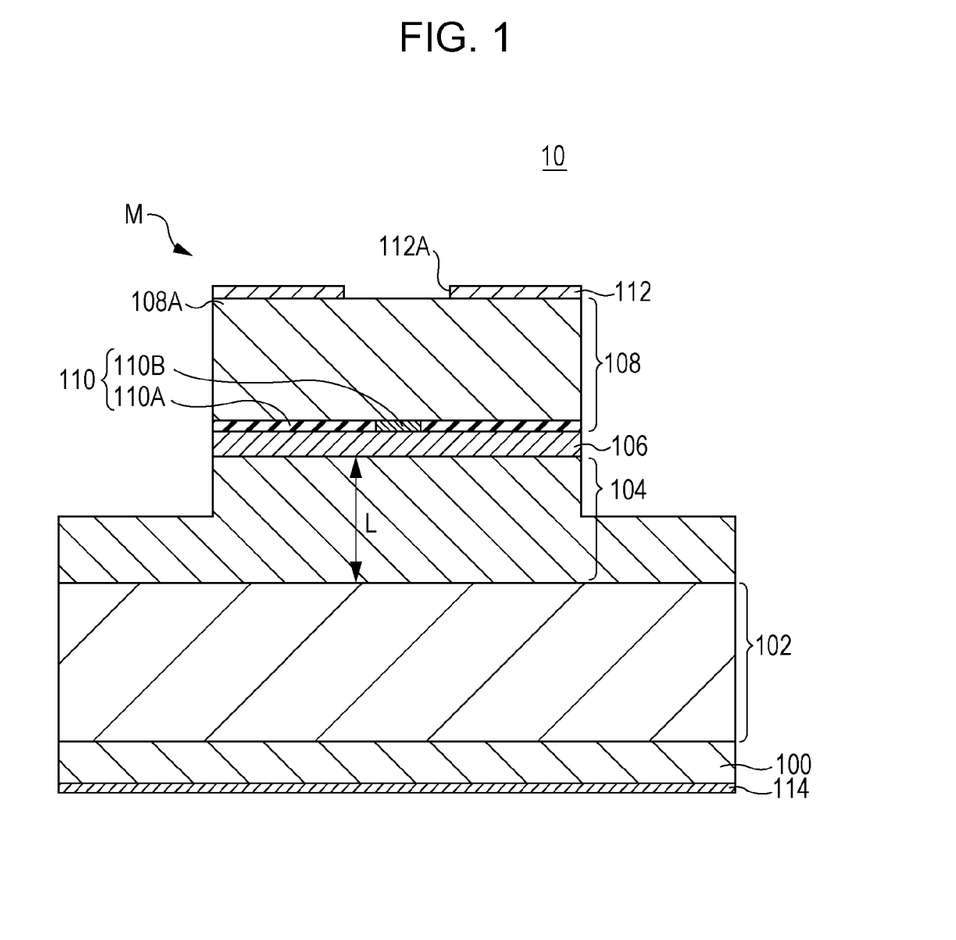
FIG. 1 is a schematic cross-sectional view of a surface-emitting semiconductor laser according to an exemplary embodiment of the invention.

FIG. 1 is a schematic cross-sectional view of a VCSEL according to a first exemplary embodiment of the invention. As illustrated in FIG. 1, the VCSEL 10 according to the first exemplary embodiment includes an n-type GaAs substrate 100; an n-type lower distributed Bragg reflector (hereinafter, abbreviated as DBR) 102 formed on the n-type GaAs substrate 100, the lower DBR 102 including low-refractive-index layers and high-refractive-index layers that are alternately stacked on top of one another; a spacer layer 104 formed on the lower DBR 102, the spacer layer 104 having a predetermined thickness of L; an active region 106 formed on the spacer layer 104; and a p-type upper DBR 108 formed on the active region 106, the upper DBR 108 including low-refractive-index layers and high-refractive-index layers that are alternately stacked on top of one another. These semiconductor layers are formed by sequential epitaxial growth.

A cylindrical mesa (i.e., columnar structure) M is formed above the substrate by etching portions of the semiconductor layers which extend from the upper DBR 108 to a midpoint of the spacer layer 104. The bottom of the mesa M, that is, the bottom of the etched portion, is configured to be positioned within the spacer layer 104 in the thickness L direction. Note that the expressions "bottom of the mesa M", "bottom of the etched portion", and "etch stop position" used herein are all synonymous.

After formation of the mesa M, a current confinement layer 110 composed of AlAs or AlGaAs having a considerably high Al content, which is formed in the vicinity of the bottom layer of the upper DBR 108 and the active region 106, is exposed at the side surfaces of the mesa. In an oxidation step, the current confinement layer 110 is selectively oxidized from the side surfaces of the mesa to form a selective oxidation region 110A and a circular conductive region 110B (i.e., oxidation aperture) surrounded by the selective oxidation region 110A.

A p-side electrode 112, which is composed of laminated metal such as Ti/Au, is disposed on the upper DBR 108. A circular light-emitting aperture 112A is formed at the center of the p-side electrode 112. The center of the light-emitting aperture 112A is substantially aligned with the center of the conductive region 110B (i.e., optical axis). The p-side electrode 112 is in ohmic contact with the upper DBR 108, and thereby carriers are injected into the upper DBR 108. An n-side electrode 114 is disposed on the rear surface of the substrate 100.

Figure 2:
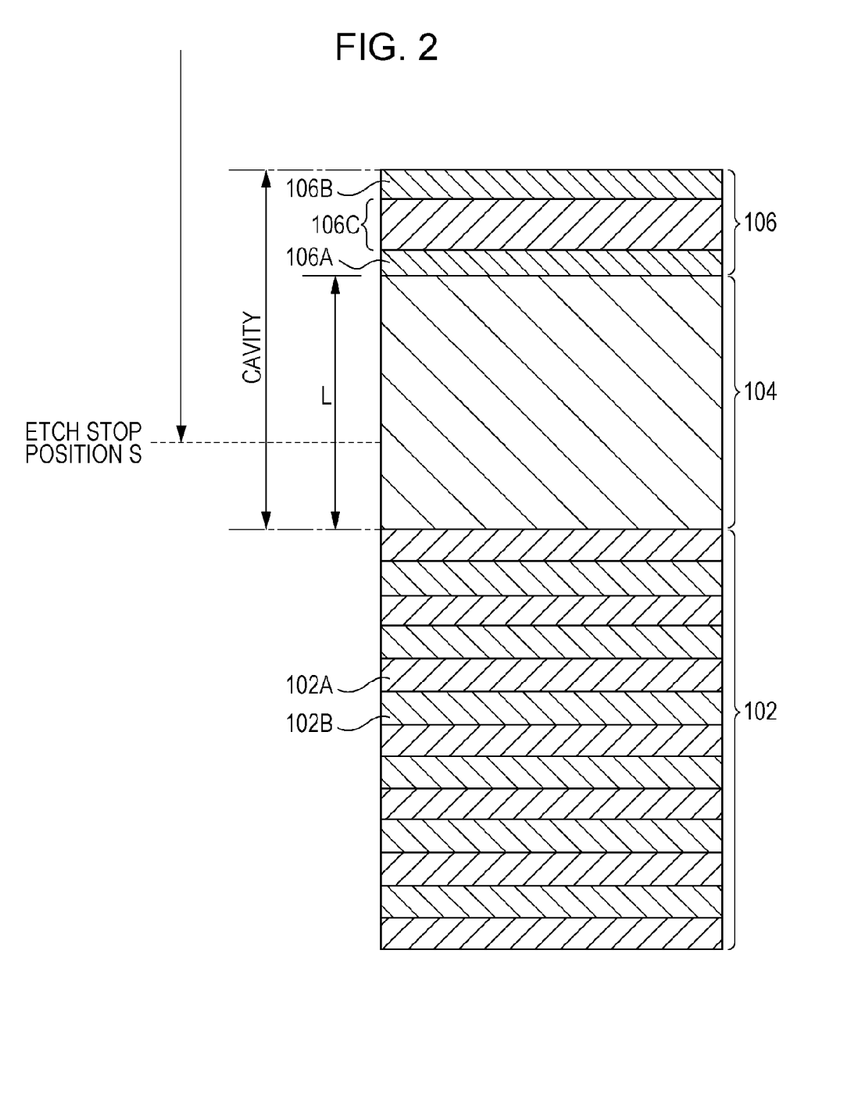
FIG. 2 is an enlarged cross-sectional view of the main section of a surface-emitting semiconductor laser according to a first exemplary embodiment of the invention.

Detailed structure of the VCSEL according to the first exemplary embodiment is described below with reference to FIG. 2, which is an enlarged cross-sectional view of the lower DBR 102, the spacer layer 104, and the active region 106 illustrated in FIG. 1. The lower DBR 102 includes plural pairs of a low-refractive-index layer 102A and a high-refractive-index layer 102B. The low-refractive-index layer 102A is composed of AlAs, which has high thermal conductivity. The high-refractive-index layer 102B is composed of, for example, $Al_{0.3}Ga_{0.7}As$. The thicknesses of the AlAs layer and the $Al_{0.3}Ga_{0.7}As$ layer are each set to $\lambda/4n_r$ (where $\lambda$ represents oscillation wavelength and $n_r$ represents the refractive index of a medium). The lower DBR 102 includes, for example, 40.5 periods of alternating layers of AlAs and $Al_{0.3}Ga_{0.7}As$. The lower DBR 102 is doped with an impurity so as to have a typical electrical conductivity. For example, the carrier concentration (i.e., impurity concentration) in the lower DBR 102 doped with silicon, which is an n-type impurity, is set to $2 \times 10^{18}$ $cm^{-3}$.

The spacer layer 104 is an epitaxially grown monolithic layer, which is interposed between the lower DBR 102 and the active region 106. The spacer layer 104 is an $Al_xGa_{1-x}As$ layer having a thickness of L and also serves as a region into which a cavity extends. In an ordinary VCSEL that does not include the spacer layer 104, the active region 106 is formed on the lower DBR 102, the active region 106 constitutes a cavity, and the optical thickness of the cavity is equal to the integral multiple of $\lambda$. In contrast, in the VCSEL 10 according to the first exemplary embodiment, in which the active region 106 and the spacer layer 104 constitute a cavity, the cavity is longer than that of an ordinary VCSEL by the thickness L of the spacer layer 104.

The Al content in the spacer layer 104 ($Al_xGa_{1-x}As$) is set to a limit value at which AlGaAs is not subject to oxidation or a value at which AlGaAs is not substantially subject to oxidation or the degree of oxidation is negligible in the oxidation step for forming the current confinement layer. The term "value at which AlGaAs is not substantially subject to oxidation or the degree of oxidation is negligible" used herein refers to a value at which the portion that extends from the side surfaces of the mesa to the center of the mesa is not fully oxidized and the portion that extends from the bottom of the etched portion of the mesa structure to the lower DBR is not fully oxidized in the oxidation step for forming the current confinement structure. The Al content x may be set, for example, $x \leq 0.95$. The spacer layer 104 is doped with silicon, which is an n-type impurity, and the amount of silicon is controlled such that the carrier concentration in the spacer layer 104 is lower than that in the lower DBR 102. The carrier concentration in the spacer layer 104 is set to, for example, $5 \times 10^{17}$ $cm^{-3}$. If the portion that extends from the side surfaces of the mesa to the center of the mesa is fully oxidized or the portion that extends from the bottom of the etched portion of the mesa structure to the lower DBR is fully oxidized in the oxidation step for forming the current confinement structure, poor electrical conduction may occur due to oxidation of the entire spacer layer or the entire AlAs layer constituting the lower DBR.

The physical thickness L of the spacer layer 104 is set large enough to remain a margin for production error resulting from etching of the mesa M. In other words, the thickness L is set such that the bottom of the mesa M, that is, the etch stop position S, is located within the spacer layer 104 but not inside the active region 106 or the lower DBR 102. The mesa M is formed by removing portions of the semiconductor layers by, for example, reactive ion etching using an etching gas such as chlorine or a mixed gas of chlorine and boron trichloride. However, it is difficult to control the etch stop position S with accuracy and high repeatability. In general, the etch stop position S is determined by controlling the etching time, but the etch stop position S may vary. Accordingly, a range in which the etch stop position S may vary is considered as a margin, and the thickness L of the spacer layer 104 is set larger than the margin. On the other hand, the optical thickness L of the spacer layer 104 may be set equal to the integral multiple of $\lambda/4n_r$ in order to enhance the laser characteristics of the cavity.

The active region 106 includes a lower spacer layer 106A formed on the spacer layer 104, an upper spacer layer 106B, and a quantum well active layer 106C interposed between the lower and upper spacer layers 106A and 106B. The lower spacer layer 106A is, for example, an undoped $Al_{0.6}Ga_{0.4}As$ layer. The quantum well active layer 106C includes, for example, an undoped $Al_{0.11}Ga_{0.89}As$ quantum well layer and an undoped $Al_{0.3}Ga_{0.7}As$ barrier layer. The upper spacer layer 106B is, for example, an undoped $Al_{0.6}Ga_{0.4}As$ layer. The active region 106 has an optical thickness equal to the oscillation wavelength $\lambda$ or the integral multiple of $\lambda$.

As illustrated in FIG. 1, the upper DBR 108 includes plural pairs of a low-refractive-index layer and a high-refractive-index layer. The low-refractive-index layer is composed of, for example, $Al_{0.9}Ga_{0.1}As$, and the high-refractive-index layer is composed of, for example, $Al_{0.3}Ga_{0.7}As$. The thickness of each layer is set to $\lambda/4n_r$. The upper DBR 108 includes, for example, 30 periods of alternating layers of $Al_{0.9}Ga_{0.1}As$ and $Al_{0.3}Ga_{0.7}As$. The carrier concentration in the upper DBR 108 doped with carbon, which is a p-type impurity, is set to, for example, $3 \times 10^{18}$ $cm^{-3}$. The top layer of the upper DBR 108 is a p-type GaAs contact layer 108A. The carrier concentration in the contact layer 108A is set to, for example, $1 \times 10^{19}$ $cm^{-3}$.

In the first exemplary embodiment, the spacer layer 104 having a thickness of L is interposed between the active region 106 and the lower DBR 102, which enables the bottom of the mesa M (i.e., bottom of the etched portion or etching stop position S) to be positioned within the spacer layer 104 in the optical-axis direction. Therefore, the upper DBR 108, the active region 106, and a portion of the spacer layer 104 are exposed at the side surfaces of the mesa, but the lower DBR 102 is not exposed. In the oxidation step for forming the current confinement layer, the AlAs layer exposed at the side surfaces of the mesa, which has a higher oxidation rate than the AlGaAs layer, is oxidized from the side surfaces of the mesa toward the inside of the mesa at a substantially constant rate. As a result, the circular conductive region 110B, which is surrounded by the oxidized region 110A, is formed in the current confinement layer 110. In the above-described oxidation step, although a portion of the spacer layer 104 is exposed at the side surfaces of the mesa, the degree of oxidation of the spacer layer 104 is negligibly small because the Al content in the spacer layer 104 is 0.95 or less. Since the lower DBR 102 is not exposed to an oxidizing atmosphere, there is no risk that the low-refractive-index layer 102A composed of AlAs is oxidized. In addition, it is possible to locate the etching stop position S a certain distance away from the active region 106, which enables the active region 106 to be protected from the adverse effects that arise from distortion due to etching and an etchant. However, the risk that the spacer layer 104 is oxidized is not eliminated by setting the Al content in the spacer layer 104 to 0.95 or less. Thus, in the oxidation step for forming the current confinement layer, the thickness of a portion of the spacer layer 104 which extends from the bottom of the mesa M to the lower DBR 102 and the Al content in the spacer layer 104 are set such that at least the lower DBR 102 is not subject to oxidation.

According to the first exemplary embodiment, as described above, the bottom of the mesa (i.e., bottom of the etched portion) can be positioned away from the active region by interposing the spacer layer 104, which is composed of a material that is not substantially subject to oxidation and has a thickness L larger than the margin for production error resulting from etching, between the active region 106 and the lower DBR 102, which makes it possible to use AlAs, which has high thermal conductivity, as a material of the low-refractive-index layer 102A constituting the lower DBR 102. This allows heat generated in the vicinity of the active layer to be dissipated toward the substrate in an effective manner, which limits a rise in the temperature of the active layer.

Figure 3A:
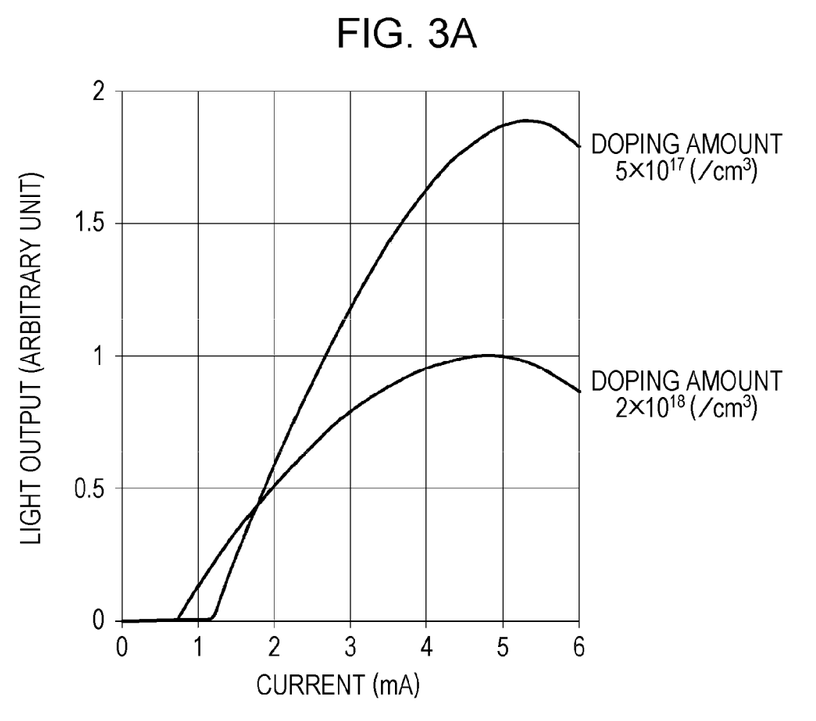
FIG. 3A is a graph illustrating the relationships between light output and operating current, which are determined by changing the doping amount in the spacer layer.
Figure 3B:
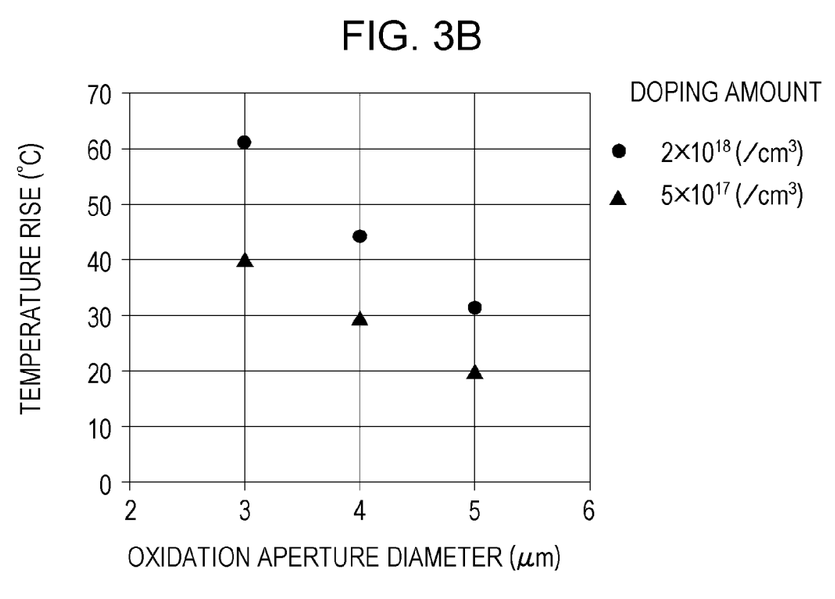
FIG. 3B is a graph illustrating the relationships between the diameter of the oxidation aperture and temperature rise, which are determined by changing the doping amount in the spacer layer.

Next, the doping dependence of the light output of the VCSEL and the doping dependence of temperature rise are described. FIG. 3A is a graph illustrating the relationships between light output and operating current, which are determined by changing the doping amount (i.e., carrier concentration) in the spacer layer. FIG. 3B is a graph illustrating the relationships between the diameter of the oxidation aperture and temperature rise, which are determined by changing the doping amount in the spacer layer.

In FIGS. 3A and 3B, a comparison is made between the case where the doping amount in the spacer layer 104 is set equal to that in the lower DBR 102, that is, to $2 \times 10^{18}$ $cm^{-3}$, and the case where the doping amount in the spacer layer 104 is set less than that in the lower DBR 102, that is, to $5 \times 10^{17}$ $cm^{-3}$. When the doping amount in the spacer layer is high, the amount of heat generated due to the light absorbed by the spacer layer 104 is increased, which consequently increases the temperature rise. Thus, the thermal saturation temperature is reached at a low current and, as a result, the maximum light output is reduced as illustrated in FIG. 3A. FIG. 3B shows that, when the diameters of the oxidation apertures (i.e., diameters of the conductive regions 110B) are equal, the larger the doped amount in the spacer layer, the larger the temperature rise regardless of the diameter of the oxidation aperture. Moreover, the larger the diameter of the oxidation aperture, the smaller the temperature rise. This is because, with an increase in the diameter of the oxidation aperture, the electrical resistance of the conductive region 110B is reduced and, accordingly, the amount of heat generated in the conductive region 110B is reduced. In addition, the density of heat generation is reduced, which enables heat to be dissipated toward the substrate in an efficient manner.

As described above, according to the first exemplary embodiment, the amount of heat generated due to light absorption can be reduced by setting the doping amount in the spacer layer 104 smaller than that in the lower DBR 102. This limits a rise in the temperature of the active layer and a reduction in light output.

The spacer layer 104 may be an undoped semiconductor layer that is not doped with any impurity. In such a case, the amount of light absorption is reduced while element resistance is increased, and the thickness L of the spacer layer 104 may be selected such that an increase in the operating current of the VCSEL and a reduction in light output are at acceptable levels. The impurity concentration in the spacer layer 104 may be set equal to that in the lower DBR 102. In such a case, the amount of light absorption is increased while element resistance is reduced, and the thickness L of the spacer layer 104 may be selected such that an increase in the operating current of the VCSEL and a reduction in light output are at acceptable levels.

In the first exemplary embodiment, the low-refractive-index layer constituting the lower DBR 102 is composed of AlAs. However, the low-refractive-index layer constituting the lower DBR 102 may also be composed of, for example, easily oxidizable AlGaAs having an Al content of 0.98 or more with high thermal conductivity. Since there is no risk that a cross section of the lower DBR are exposed in the oxidation step, it is possible to use AlGaAs having an Al content of more than 0.95 as a material of the low-refractive-index layer constituting the lower DBR.

Figure 4:
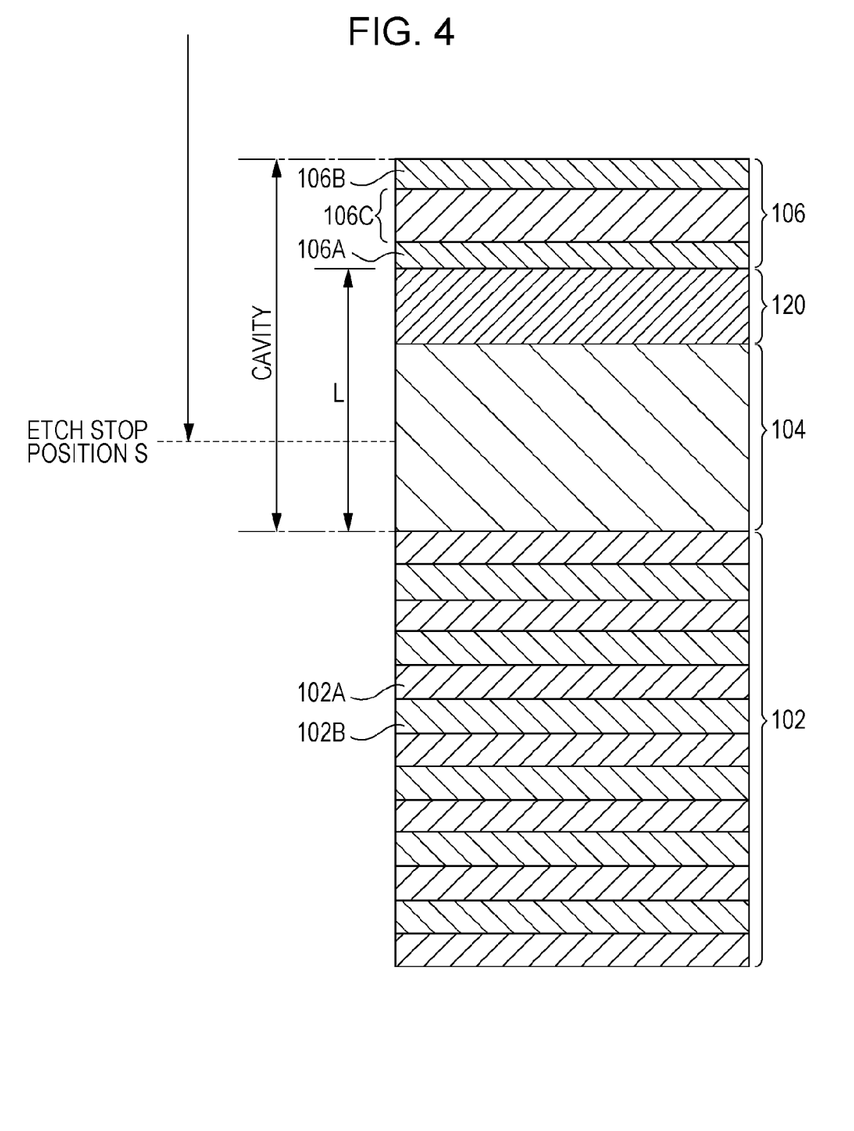
FIG. 4 is an enlarged cross-sectional view of the main section of a surface-emitting semiconductor laser according to a second exemplary embodiment of the invention.

The second exemplary embodiment of the invention is described below. FIG. 4 is an enlarged cross-sectional view of an active region, a spacer layer, and a lower DBR constituting a VCSEL according to the second exemplary embodiment. The VCSEL according to the second exemplary embodiment is different from the VCSEL according to the first exemplary embodiment in that the VCSEL according to the second exemplary embodiment further includes a carrier block layer 120 interposed between the active region 106 and the spacer layer 104.

In the case where the Al content in the spacer layer 104 is low, a low-energy region (i.e., small-band-gap region) extends over a long distance from the active layer in the growth direction. This may results in leakage of carriers, which leads to an increase in the threshold current, degradation of temperature characteristics, and the like. Therefore, in the second exemplary embodiment, the carrier block layer 120, which has a larger band gap than the active region 106 and the spacer layer 104, is interposed between the active region 106 and the spacer layer 104. The carrier block layer 120 is an $Al_yGa_{1-y}As$ layer having a larger band gap than a lower spacer layer 106A constituting the active region 106 and causes carriers to be confined within a quantum well active layer 106C. The band gap in the carrier block layer 120 can be determined depending by controlling the fraction (x) of Al content. The band gap can be increased by increasing the fraction of Al content.

In the second exemplary embodiment, the Al content in the carrier block layer 120 is set $0.80 < y \leq 0.95$. Similarly to the spacer layer 104, the maximum Al content in the carrier block layer 120 is set to about 0.95 in order to prevent the carrier block layer 120 from being oxidized. The minimum Al content in the carrier block layer 120 is set to about 0.80 in order to block carriers in an effective manner. If the difference in band gap between the carrier block layer 120 and the adjacent layers is excessively small, it becomes difficult to block the carriers in an effective manner.

The carrier block layer 120 serves, together with the spacer layer 104, as a region into which a cavity extends. Therefore, the carrier block layer 120 may have an optical thickness equal to the integral multiple of $\lambda/4n_r$ in order to achieve good laser characteristics. The total physical thickness L of the carrier block layer 120 and the spacer layer 104 is set larger than the margin for production error resulting from etching as in the first exemplary embodiment.

The doping amount in the carrier block layer 120 may be controlled such that the carrier concentration in the carrier block layer 120 is smaller than that in the lower DBR 102. The doping amount in the carrier block layer 120 may also be controlled such that the carrier concentration in the carrier block layer 120 is smaller than that in the spacer layer 104. Since the active layer is located closer to the carrier block layer 120 than to the spacer layer 104, the carrier block layer 120 further reduces the amount of light absorption and thereby limits a reduction in light output.

Figure 5:
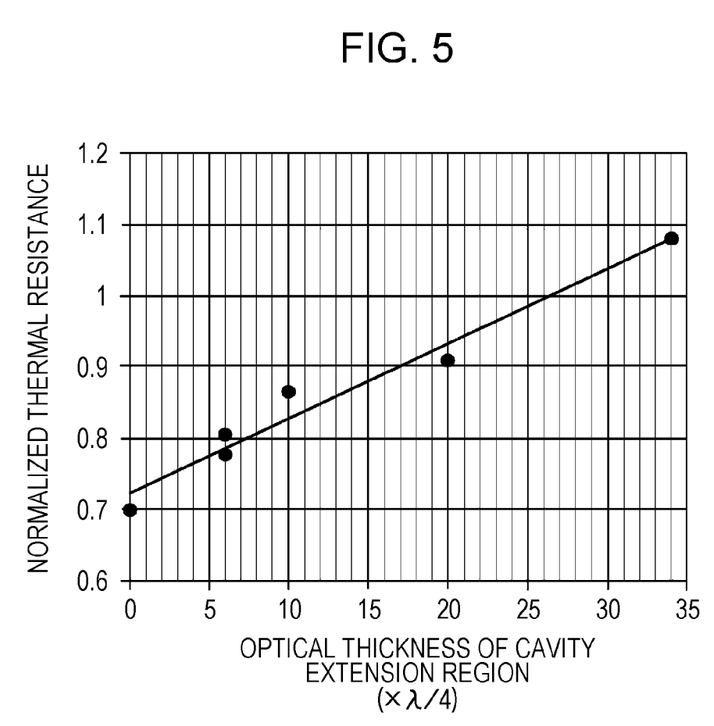
FIG. 5 is a graph illustrating the dependence of heat resistance on the optical thickness of the cavity extension region.

Next, the dependence of thermal resistance on the thickness of the cavity extension region is described. Hereinafter, the spacer layer 104 described in the first exemplary embodiment and the spacer layer 104 and the carrier block layer 120 described in the second exemplary embodiment are collectively referred to as "cavity extension region". The thickness L of the cavity extension region is set larger than the margin for production error resulting from etching. However, if the thickness L is excessively large, the heat resistance may become excessively high. Thus, an optical thickness of the cavity extension region at which the cavity extension region has a heat resistance comparable to that of a lower DBR of a standard VCSEL that does not include the cavity extension region is determined by changing the optical thickness of the cavity extension region according to the exemplary embodiment. This optical thickness is defined as the optical thickness of the cavity extension region in the exemplary embodiment. Thus, the thickness L may be set equal to or smaller than the optical thickness. In the exemplary embodiment, it is considered that the lower DBR of a standard VCSEL is composed of $Al_{0.9}Ga_{0.1}As/Al_{0.3}Ga_{0.7}As$, and the heat resistance of such a lower DBR is used for normalization of heat resistance. Note that, the low-refractive-index layers constituting the lower DBR according to the exemplary embodiment are composed of AlAs.

FIG. 5 is a graph illustrating the relationship between the normalized heat resistance and the optical thickness of the cavity extension region based on the test results, which is a substantially linear relationship. When the normalized heat resistance is "1", the optical thickness of the cavity extension region is $26\lambda/4$, which is considered to be the optical thickness. Therefore, the optical thickness of the cavity extension region may be set to $26\lambda/4$ or less. Furthermore, as is apparent from FIG. 5, the smaller the optical thickness of the cavity extension region, the greater the effect of limiting temperature rise. Thus, the optical thickness of the cavity extension region may be selected such that the difference between the optical thickness of the cavity extension region and the margin for production error resulting from etching is minimized. For example, in the case where the mesa is formed by reactive ion etching, the range in which the etching stop position may vary, that is, the margin for production error, is $\lambda$ to $1.5\lambda$. Thus, in such a case, the optical thickness L of the cavity extension region is set to $\lambda$ to $1.5\lambda$ or more. In the case where the optical thickness L of the cavity extension region is set to $1.5\lambda$, the overall length of the cavity including the cavity extension region is $2.5\lambda$ when the optical thickness of the active region 106 is $\lambda$. This is considerably small thickness compared with a VCSEL having a long-cavity structure including a cavity extension region having an optical thickness of several tens of $\lambda$. As described above, the optical thickness of the cavity extension region according to the exemplary embodiment is set to, for example, $\lambda$ to $26\lambda/4$ or $1.5\lambda$ to $26\lambda/4$. In the case where greater importance is placed on heat resistance, the optical thickness L is set to $20\lambda/4$ or less, $16\lambda/4$ or less, or $12\lambda/4$ or less.

Figure 6A:
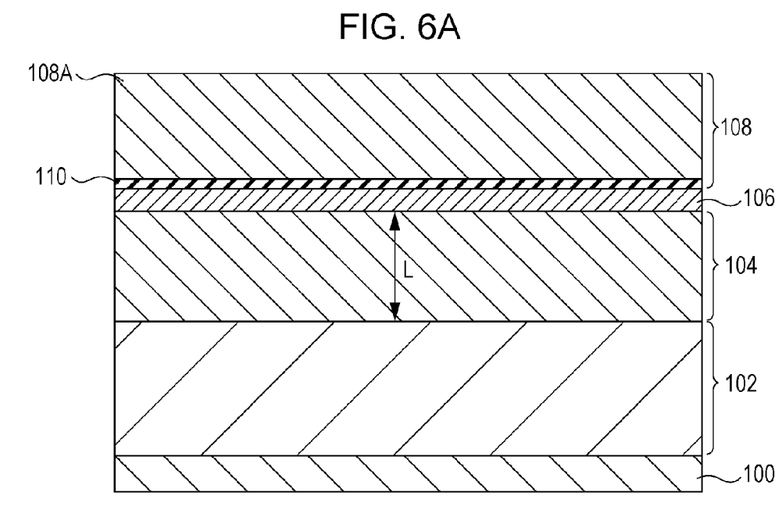
FIGS. 6A and 6B are schematic cross-sectional views of a surface-emitting semiconductor laser according to a first exemplary embodiment of the invention, illustrating a part of the process for producing the surface-emitting semiconductor laser.

A method for producing the VCSEL according to the first exemplary embodiment of the invention is described with reference to FIGS. 6A and 6B. The following layers are stacked on and above an n-type GaAs substrate 100 by metal-organic chemical vapor deposition (MOCVD) as illustrated in FIG. 6A: an n-type lower DBR 102 including 40.5 periods of alternating layers of AlAs and $Al_{0.3}Ga_{0.7}As$ having a carrier concentration of $2\times10^{18}$ cm$^{-3}$, the thickness of each layer being set equal to a quarter of the wavelength in the medium; a $Al_xGa_{1-x}As$ spacer layer 104 having a thickness of L; an active region 106 including an undoped $Al_{0.6}Ga_{0.4}As$ lower spacer layer, an undoped $Al_{0.11}Ga_{0.89}As$ quantum well layer, an undoped $Al_{0.3}Ga_{0.7}As$ barrier layer, and an undoped $Al_{0.6}Ga_{0.4}As$ upper spacer layer; and a p-type upper DBR 108 including 24 periods of alternating layers of p-type $Al_{0.9}Ga_{0.1}As$ and $Al_{0.3}Ga_{0.7}As$ having a carrier concentration of $3\times10^{18}$ cm$^{-3}$, the thickness of each layer being set equal to a quarter of the wavelength in the medium. A p-type GaAs contact layer 108A having a carrier concentration of $1\times10^{19}$ cm$^{-3}$ is formed as the top layer of the upper DBR 108. A p-type current confinement layer (i.e., AlAs layer) 110 is formed on or inside the bottom layer of the upper DBR 108. A buffer layer (not shown in the drawing) may optionally be interposed between the substrate 100 and the lower DBR 102. Furthermore, a composition-gradient layer may optionally be interposed between each pairs of the layers in order to reduce resistance spikes that may occur at the interfaces of the layers.

Figure 6B:
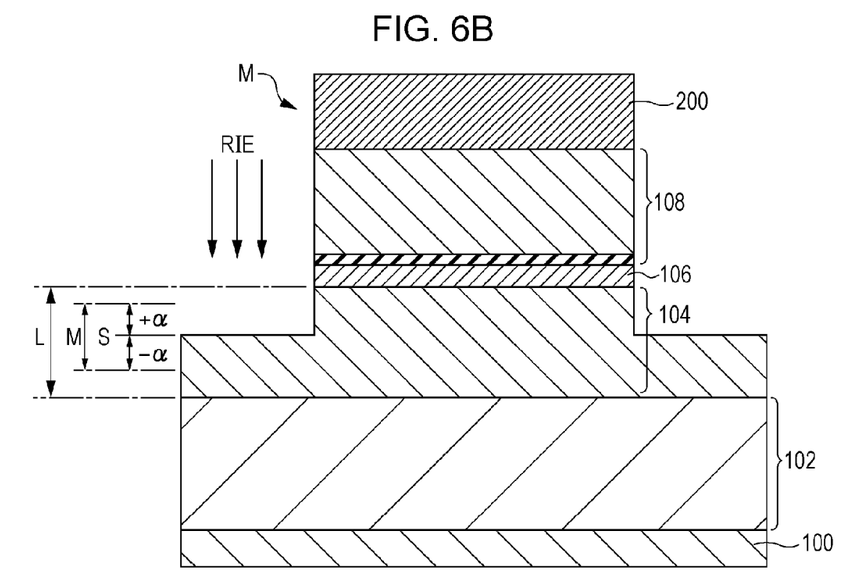

A circular etching mask 200 is formed on the upper DBR 108 in order to form a cylindrical mesa as illustrated in FIG. 6B. Portions of the semiconductor layers which extend from the upper DBR 108 to a midpoint of the spacer layer 104 in the thickness direction are removed by reactive ion etching using an etching gas such as boron trichloride. The etching time is controlled such that the etching stop position S is positioned at, for example, substantially the middle of the spacer layer 104. Although the targeted etching stop position S may vary within the range between S+α and S−α, that is, the margin M, it is possible to set the etching stop position S within the spacer layer 104 since the thickness L of the spacer layer 104 satisfies the relationship L>M.

After formation of the mesa M, oxidation is performed at a constant temperature for a predetermined period of time to form an oxidation aperture having a desired diameter in the current confinement layer 110. In this oxidation step, the upper DBR 108, the active region 106, and a portion of the spacer layer 104 are exposed to an oxidizing atmosphere. However, the degree of oxidation of AlGaAs is negligibly small since the Al content in the spacer layer 104 is 0.95 or less. In addition, there is no risk of oxidation of AlAs since the low-refractive-index layer constituting the lower DBR 102 is not exposed to an oxidizing atmosphere.

The structures of the carrier block layer 120 and the spacer layer 140 according to the second exemplary embodiment are further described below. For example, the carrier block layer 120 may have an Al content of 0.9 and a carrier concentration of $2\times10^{18}$ cm$^{-3}$ and the spacer layer 104 may have an Al content of 0.9 and a carrier concentration of $1\times10^{17}$ cm$^{-3}$. In this case, while the two layers have the same Al content, the carrier block layer has a higher carrier concentration, which enhances the property of confining carriers within the active region (i.e., carrier-blocking property), and the spacer layer has a lower carrier concentration, which limits temperature rise. As described above, even when the carrier block layer 120 and the spacer layer 140 have the same Al content, changing impurity concentrations in the thickness direction enables the amount of light absorption to be reduced, which limits temperature rise, and enhances the property of confining carriers, which improves high-temperature performance.

Alternatively, for example, the carrier block layer 120 may have an Al content of 0.9 and a carrier concentration of $2\times10^{18}$ cm$^{-3}$ and the spacer layer 104 may have an Al content of 0.95 and a carrier concentration of $1\times10^{17}$ cm$^{-3}$.

In other words, the Al content in the carrier block layer 120 may be set such that the carrier-blocking property of the carrier block layer is not impaired, and the spacer layer 104 may have a higher Al content than the carrier block layer. The spacer layer 104 having a high Al content enables a structure having high thermal conductivity, which is for heat dissipation, to be formed. Therefore, the above-described structure may be employed when importance is placed on heat dissipation.

In another case, for example, the spacer layer 104 may have an Al content of 0.3 and a carrier concentration of $1\times10^{17}$ cm$^{-3}$, and a carrier block layer 120 may have an Al content of 0.9 and a carrier concentration of $2\times10^{18}$ cm$^{-3}$. In other words, the spacer layer 104 may have a lower Al content than the carrier block layer as long as the Al content in the carrier block layer 120 is set such that the carrier-blocking property of the carrier block layer is not impaired. Setting the Al content in the spacer layer 104 low reduces the risk that the portion that extends from the bottom of the etched portion of the mesa structure to the lower DBR is fully oxidized in the oxidation step for forming the current confinement structure even in the case where the position of the bottom of the etched portion of the mesa structure varies in the direction toward the lower DBR. This reduces the risk that the AlAs layer constituting the lower DBR is fully oxidized.

Various examples are described in the first and second exemplary embodiments above. However, the invention is not limited by these exemplary embodiments. The fractions of Al content described in the above-described exemplary embodiments are only examples, and the fraction of Al content may be selected appropriately depending on the purpose and application. The current confinement layer is not necessarily composed of AlAs, but may also be composed of, for example, AlGaAs having an Al content of about 0.98. In the above-described exemplary embodiments, an n-side electrode is disposed on the rear surface of the substrate. However, the n-side electrode is not necessarily disposed on the rear surface of the substrate, but may also be disposed on the side of the front surface of the substrate so as to be electrically connected to the lower DBR. In the above-described exemplary embodiments, an AlGaAs-type VCSEL is described as an example. However, the VCSEL may include another Group III-V semiconductor. In the above-described exemplary embodiments, a single-spot VCSEL is described as an example. However, the VCSEL may be a multi-spot VCSEL or a VCSEL array including plural mesas (i.e., light-emitting portions) disposed on a substrate.

Figure 7A:
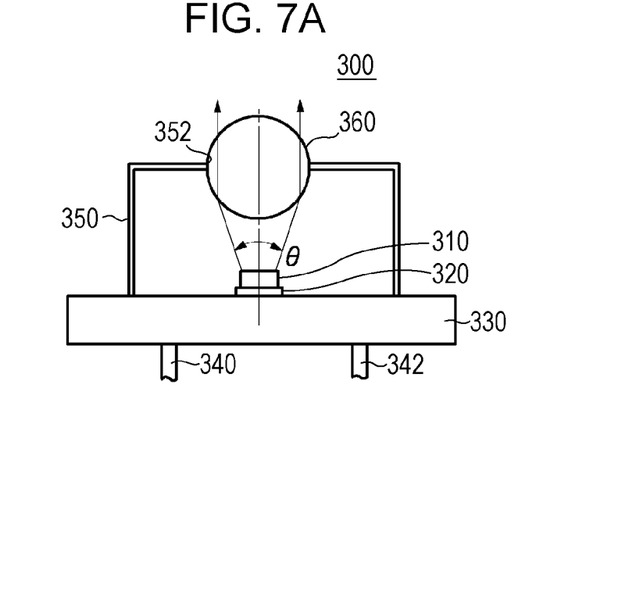
FIGS. 7A and 7B are schematic cross-sectional views of surface-emitting semiconductor laser devices in which the surface-emitting semiconductor laser according to an exemplary embodiment of the invention and an optical element are packaged.

Next, a surface-emitting semiconductor laser device, an optical information processing device, and an optical transmission device that include the VCSEL according to the exemplary embodiment of the invention are described with reference to the attached drawings. FIG. 7A is a cross-sectional view of a surface-emitting semiconductor laser device in which the VCSEL and an optical element are packaged. In the surface-emitting semiconductor laser device 300, a chip 310 including the VCSEL disposed thereon is fixed to a disk-shaped metal stem 330 with a conductive adhesive 320. Conductive leads 340 and 342 are inserted into through-holes (not illustrated in the drawing) formed in the stem 330. The lead 340 is electrically connected to the n-side electrode of the VCSEL, and the lead 342 is electrically connected to the p-side electrode of the VCSEL.

A rectangular hollow cap 350 is fixed to the stem 330 including the chip 310. An optical element, such as a ball lens 360, is fixed inside an opening 352 formed at the center of the cap 350. The optical axis of the ball lens 360 is positioned so as to be aligned with substantially the center of the chip 310. When a forward voltage is applied between the leads 340 and 342, the chip 310 emits a laser beam in the vertical direction. The distance between the chip 310 and the ball lens 360 is controlled such that the ball lens 360 is positioned within a region corresponding to the angle θ of divergence of the laser beam emitted by the chip 310. Optionally, a photodetector or a temperature sensor may be disposed inside the cap in order to monitor the light-emitting state of the VCSEL.

Figure 7B:
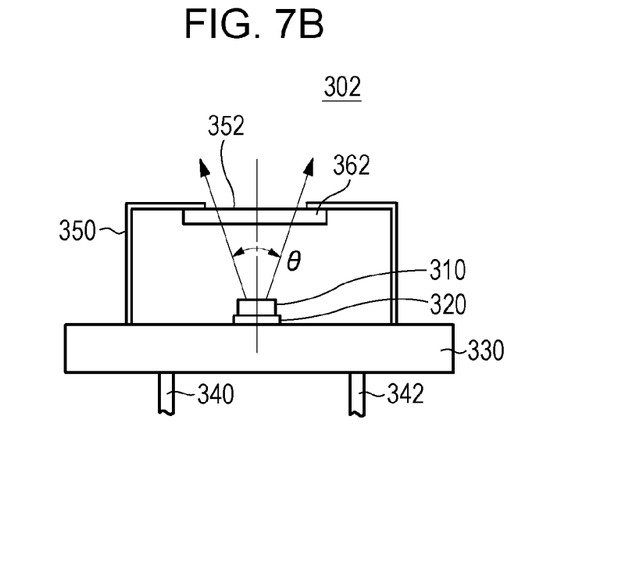

FIG. 7B illustrates the structure of another surface-emitting semiconductor laser device. A surface-emitting semiconductor laser device 302 illustrated in FIG. 7B includes a flat glass 362 instead of the ball lens 360. The flat glass 362 is fixed inside the opening 352 formed at the center of the cap 350. The flat glass 362 is positioned such that the center of the flat glass 362 is substantially aligned with the center of the chip 310. The distance between the chip 310 and the flat glass 362 is controlled such that the diameter of the opening of the flat glass 362 entirely covers a region corresponding to the angle θ of divergence of the laser beam emitted by the chip 310.

Figure 8:
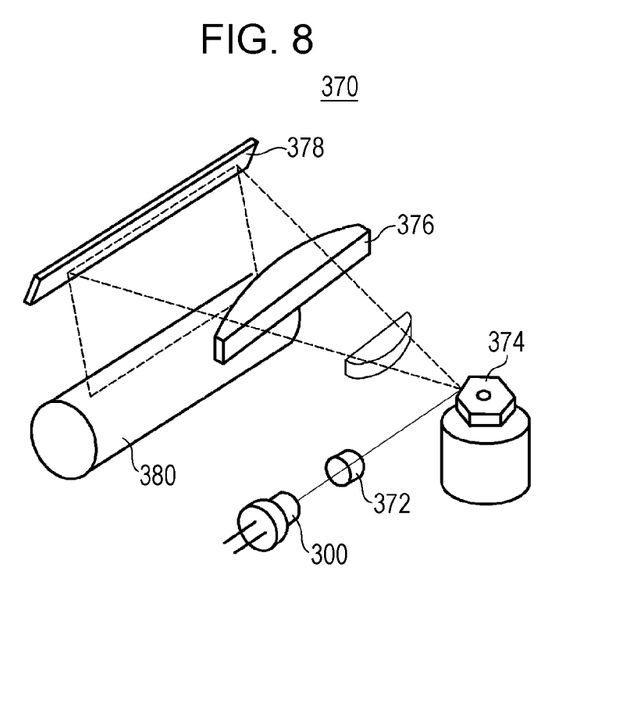
FIG. 8 illustrates an example of an information processing device that includes the surface-emitting semiconductor laser according to an exemplary embodiment of the invention serving as a light source device.

FIG. 8 illustrates an example of an optical information processing device that includes the VCSEL serving as a light source. An optical information processing device 370 includes; a collimator lens 372 through which a laser beam emitted by the surface-emitting semiconductor laser device 300 or 302 including the VCSEL packaged therein as illustrated in FIG. 7A or 7B enters; a polygon mirror 374 that rotates at a constant speed and reflects a bundle of light beams, which is passed through the collimator lens 372, at a certain angle of divergence; an fθ lens 376 through which the laser beam reflected by the polygon mirror 374 enters and enables a reflecting mirror 378 to be irradiated with the laser beam; a linear reflecting mirror 378; and a photoreceptor drum (i.e., recording medium) 380 on which a latent image is formed on the basis of the light reflected by the reflecting mirror 378. The VCSEL according to the exemplary embodiment of the invention may be used as a light source of an optical information processing device, such as a copying machine or a printer, that includes an optical system that condenses a laser beam emitted by the VCSEL on a photoreceptor drum and a mechanism that scans the photoreceptor drum with the condensed laser beam.

Figure 9:
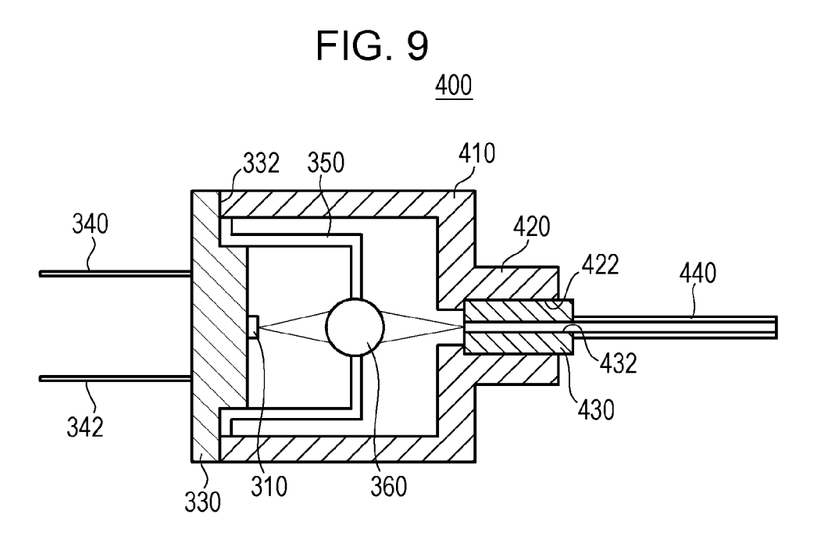
FIG. 9 is a schematic cross-sectional view of an optical transmission device that includes the surface-emitting semiconductor laser according to an exemplary embodiment of the invention.

FIG. 9 is a cross-sectional view of an optical transmission device that includes the surface-emitting semiconductor laser device illustrated in FIG. 7A. An optical transmission device 400 includes a stem 330; a cylindrical housing 410 fixed to the stem 330; a sleeve 420 integrally formed at an end of the housing 410; a ferrule 430 held inside an opening 422 formed in the sleeve 420; and an optical fiber 440 held by the ferrule 430. A flange 332 is formed on the stem 330 in the circumferential direction. The other end of the housing 410 is fixed to the flange 332. The ferrule 430 is precisely positioned inside the opening 422 of the sleeve 420, and thereby the optical axis of the optical fiber 440 is aligned with the optical axis of the ball lens 360. A core wire of the optical fiber 440 is held inside a through-hole 432 formed in the ferrule 430.

A laser beam emitted from the surface of the chip 310 is condensed by the ball lens 360, and the condensed light enters the core wire of the optical fiber 440 and is thereby transmitted. Although the ball lens 360 is used in the above example, lenses other than a ball lens, such as a biconvex lens and a planoconvex lens, may also be used instead. The optical transmission device 400 may optionally include a driving circuit that applies an electric signal between the leads 340 and 342. The optical transmission device 400 may optionally include a receiving unit that receives an optical signal via the optical fiber 440.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A surface-emitting semiconductor laser comprising:
   a substrate;
   a first semiconductor multilayer reflector of a first conductivity type formed on the substrate, the first semiconductor multilayer reflector including a plurality of pairs of a low-refractive-index layer and a high-refractive-index layer;
   a cavity region formed on the first semiconductor multilayer reflector;
   a second semiconductor multilayer reflector of a second conductivity type formed on the cavity region, the second semiconductor multilayer reflector including a plurality of pairs of a low-refractive-index layer and a high-refractive-index layer;
   a columnar structure extending from the second semiconductor multilayer reflector to the cavity region; and
   a current confinement layer formed inside the columnar structure by selective oxidation of a semiconductor layer containing Al,
   wherein the cavity region includes
      an active region; and
      a cavity extension region interposed between the active region and the first semiconductor multilayer reflector,
   wherein the bottom of the columnar structure is positioned within the cavity extension region in the film-thickness direction,
   wherein the cavity extension region is composed of $Al_xGa_{1-x}As$, where x represents an Al content, the Al content being set such that the cavity extension region is not substantially subject to oxidation or the degree of oxidation of the cavity extension region is negligible, and
   wherein the low-refractive-index layer constituting the first semiconductor multilayer reflector has an Al content equal to or higher than an Al content in the current confinement layer.

2. The surface-emitting semiconductor laser according to claim 1,
   wherein a concentration of an impurity of the first conductivity type in the cavity extension region is lower than an impurity concentration in the first semiconductor multilayer reflector.

3. The surface-emitting semiconductor laser according to claim 1, wherein the cavity extension region further includes a carrier block layer adjacent to the active region, the carrier block layer having a higher Al content than the active region.

4. The surface-emitting semiconductor laser according to claim 1,
wherein the cavity extension region is composed of $Al_xGa_{1-x}As$, where $x \leq 0.95$.

5. The surface-emitting semiconductor laser according to claim 3,
wherein the carrier block layer is composed of $Al_yGa_{1-y}As$, where $0.8 < y \leq 0.95$.

6. The surface-emitting semiconductor laser according to claim 3,
wherein the carrier block layer has a higher impurity concentration than any other region constituting the cavity extension region.

7. The surface-emitting semiconductor laser according to claim 3,
wherein the carrier block layer has a lower Al content than any other region constituting the cavity extension region.

8. The surface-emitting semiconductor laser according to claim 3,
wherein the carrier block layer has a higher Al content than any other region constituting the cavity extension region.

9. The surface-emitting semiconductor laser according to claim 3,
wherein a concentration of an impurity of the first conductivity type in the carrier block layer is lower than an impurity concentration in the first semiconductor multilayer reflector.

10. The surface-emitting semiconductor laser according to claim 1,
wherein the cavity extension region has a thickness larger than a range of production fluctuations resulting from etching of the columnar structure.

11. The surface-emitting semiconductor laser according to claim 1,
wherein the cavity extension region has an optical thickness equal to an integral multiple of $\lambda/4$, where $\lambda$ represents oscillation wavelength.

12. The surface-emitting semiconductor laser according to claim 1,
wherein the cavity extension region has an optical thickness equal to or less than $26\lambda/4$, where $\lambda$ represents oscillation wavelength.

13. The surface-emitting semiconductor laser according to claim 1,
wherein the cavity extension region has an optical thickness equal to or less than $12\lambda/4$, where $\lambda$ represents oscillation wavelength.

14. The surface-emitting semiconductor laser according to claim 3,
wherein the carrier block layer has an optical thickness equal to an integral multiple of $\lambda/4$, where $\lambda$ represents oscillation wavelength.

15. The surface-emitting semiconductor laser according to claim 1,
wherein the low-refractive-index layer constituting the first semiconductor multilayer reflector is composed of AlAs.

16. A surface-emitting semiconductor laser device comprising:
the surface-emitting semiconductor laser according to claim 1; and
an optical element that light emitted by the surface-emitting semiconductor laser enters.

17. An optical transmission device comprising:
the surface-emitting semiconductor laser device according to claim 16; and
a transmission unit that transmits a laser beam emitted by the surface-emitting semiconductor laser device via an optical medium.

18. An information processing device comprising:
the surface-emitting semiconductor laser according to claim 1;
a light-condensing unit that condenses a laser beam emitted by the surface-emitting semiconductor laser on a recording medium; and
a mechanism that scans the recording medium with the laser beam condensed by the light-condensing unit.

* * * * *